United States Patent
Jimenez et al.

(10) Patent No.: US 9,287,254 B2
(45) Date of Patent: Mar. 15, 2016

(54) ELECTRONIC DEVICE AND PROTECTION CIRCUIT

(71) Applicant: STMicroelectronics S.A., Montrouge (FR)

(72) Inventors: Jean Jimenez, Saint Theoffrey (FR); Boris Heitz, Grenoble (FR); Johan Bourgeat, Saint Pierre d'allevard (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 14/599,167

(22) Filed: Jan. 16, 2015

(65) Prior Publication Data
US 2015/0214210 A1    Jul. 30, 2015

(30) Foreign Application Priority Data

Jan. 30, 2014  (FR) ...................... 14 50726

(51) Int. Cl.
| | |
|---|---|
| *H02H 9/00* | (2006.01) |
| *H01L 27/02* | (2006.01) |
| *H01L 27/12* | (2006.01) |
| *H01L 27/06* | (2006.01) |
| *H01L 29/74* | (2006.01) |
| *H01L 29/747* | (2006.01) |

(52) U.S. Cl.
CPC ........ *H01L 27/0248* (2013.01); *H01L 27/0262* (2013.01); *H01L 27/0623* (2013.01); *H01L 27/1203* (2013.01); *H01L 29/747* (2013.01); *H01L 29/7436* (2013.01)

(58) Field of Classification Search
CPC .................. H01L 27/0259; H01L 27/0262
USPC .............. 257/355, 356; 361/56, 111
See application file for complete search history.

(56) References Cited

U.S. PATENT DOCUMENTS

| | | | | |
|---|---|---|---|---|
| 5,550,699 | A * | 8/1996 | Diaz ...................... | H02H 9/046 361/111 |
| 5,572,394 | A * | 11/1996 | Ker ...................... | H01L 27/0259 361/111 |
| 2001/0025963 | A1 * | 10/2001 | Tashiro .................. | H01L 21/84 257/173 |
| 2002/0167052 | A1 | 11/2002 | Chang et al. | |
| 2004/0201033 | A1 | 10/2004 | Russ et al. | |
| 2006/0268478 | A1 | 11/2006 | Lai et al. | |
| 2008/0088993 | A1 | 4/2008 | Entringer et al. | |
| 2011/0210418 | A1 * | 9/2011 | Esmark .................. | H01L 23/60 257/517 |
| 2012/0319204 | A1 | 12/2012 | Benoist et al. | |

* cited by examiner

*Primary Examiner* — Cuong Q Nguyen
*Assistant Examiner* — Nishath Yasmeen
(74) *Attorney, Agent, or Firm* — Slater & Matsil, L.L.P.

(57) ABSTRACT

An electronic device includes a first device terminal and a second device terminal. A first and a second thyristor are reverse-connected between the two device terminals. A first and a second MOS transistor are respectively coupled between the conduction electrodes (emitters and collectors) of the two NPN transistors of the two thyristors. A third MOS transistor is coupled between the emitters of the two NPN bipolar transistors of the two thyristors and a fourth MOS transistor is coupled between the bases of the two PNP bipolar transistors of the two thyristors. A gate region is common to all the MOS transistors and a semiconductor substrate region includes the substrates of all the MOS transistors.

20 Claims, 7 Drawing Sheets

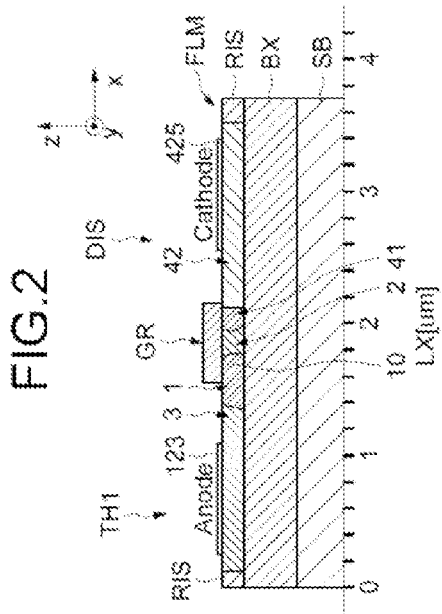
FIG.2
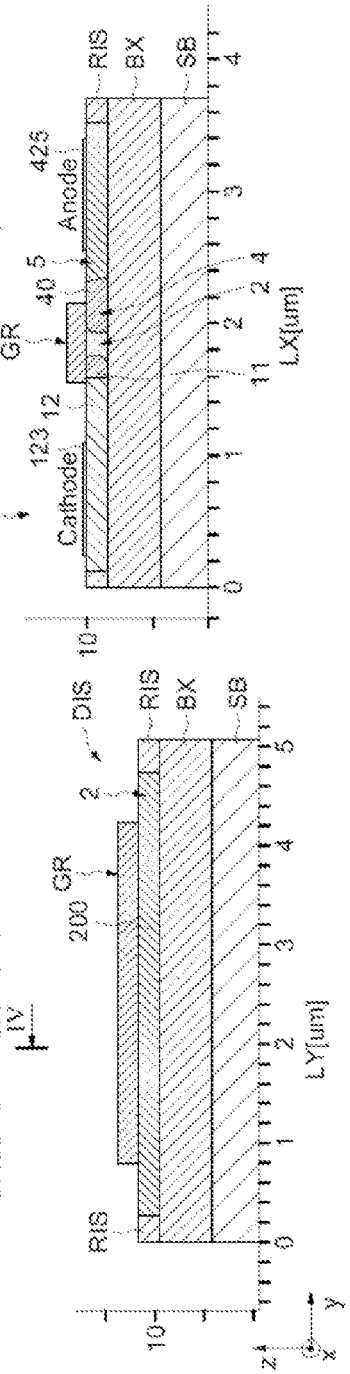
FIG.3
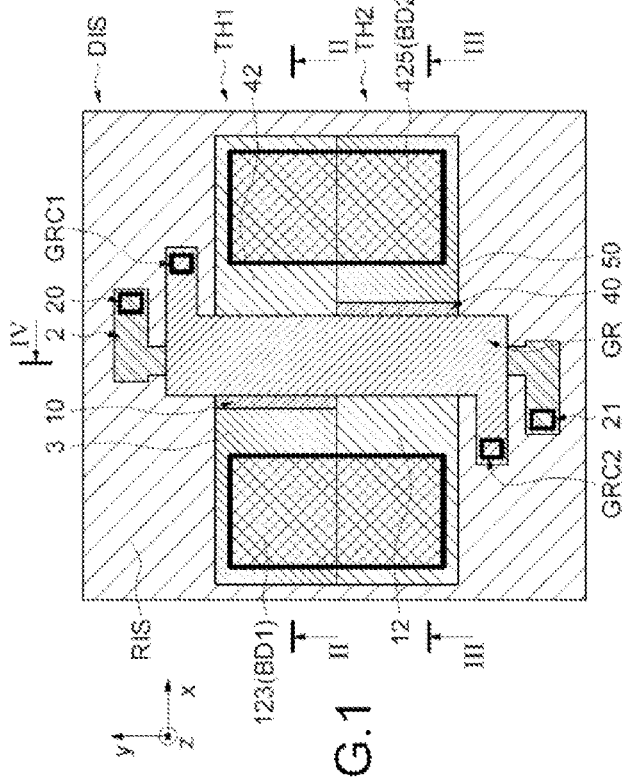
FIG.1
FIG.4

ELECTRONIC DEVICE AND PROTECTION CIRCUIT

This application claims the benefit of French Application No. 1450726, filed on Jan. 30, 2014, which application is hereby incorporated herein by reference.

TECHNICAL FIELD

The invention relates to electronic devices, and notably those designed for the protection of components against electrostatic discharges (or ESD).

BACKGROUND

Generally speaking, the devices for protection against electrostatic discharges comprise a large number of diodes in series, for example of the order of twenty for an electronic system to be protected operating at 15 volts.

In order to reduce the number of components, U.S. Patent application 2008/0088993A1 provides a gated thyristor designed notably for the protection against electrostatic discharges. However, in certain cases, such a gated thyristor exhibits a significant instability and requires several triggering circuits in order to trigger the thyristor in the presence of an ESD pulse. The number of components for providing an ESD protection is reduced because such a thyristor needs two triggering circuits which, for a reversible protection, leads to six components (two thyristors and four triggering circuits). However, the need for the presence of such a triggering system still leads to constraints on the surface occupation of such a protection circuit and may, in certain cases, turn out to be complex to implement.

SUMMARY

According to one embodiment, an electronic device is provided, based on a single-gate triac which occupies less surface area.

According to another embodiment, such an electronic device is provided that is stable and self-triggering, in other words that does not require a specific triggering circuit in order to trigger it, notably in the presence of an ESD pulse.

According to one aspect, the invention provides an electronic device comprising a first device terminal, a second device terminal, a first and a second thyristor reverse-connected between the two device terminals, a first and a second MOS transistor respectively coupled between the conduction electrodes (emitters and collectors) of the two NPN transistors of the two thyristors, a third MOS transistor coupled between the emitters of the two NPN bipolar transistors of the two thyristors, a fourth MOS transistor coupled between the bases of the two PNP bipolar transistors of the two thyristors, a gate region common to all the MOS transistors and a semiconductor substrate region including the substrates of all the MOS transistors.

Thus, a device is obtained that possesses four terminals, namely the two aforementioned device terminals together with two other control terminals respectively coupled to the common gate region and to the semiconductor substrate region and which can be used, in certain cases, in order to be connected to at least one trigger circuit.

The surface area occupied and the complexity of implementation of such a device are consequently reduced.

Furthermore, the device is characterized in particular by a specific topology comprising not only two gated reverse-connected thyristors, but also two MOS transistors in addition to the two MOS transistors of the two gated thyristors, connected between the two device terminals, which affords a gain in terms of power performance.

Although such a device may be fabricated using any technology, notably a bulk silicon substrate technology, it is especially applicable to a technology of the silicon-on-insulator (or SOI) type.

Thus, according to one embodiment, the device is fabricated using a technology of the silicon-on-insulator type. A semiconductor film is located on top of an insulating layer (commonly denoted by those skilled in the art under the acronym BOX: "Buried OXide") itself situated on top of a carrier substrate. A first semiconductor region has a first type of conductivity, for example an N type of conductivity, and includes the base region of the PNP bipolar transistor of the first thyristor, the collector region of the NPN bipolar transistor of the first thyristor, the emitter region of the NPN bipolar transistor of the second thyristor and the cathode region of the second thyristor.

A second semiconductor region has a second type of conductivity opposite to the first, for example a P type of conductivity, incorporating the base region of the NPN bipolar transistor of the first thyristor, the collector region of the PNP bipolar transistor of the first thyristor, the base region of the NPN bipolar transistor of the second thyristor, the collector region of the PNP bipolar transistor of the second thyristor and the semiconductor substrate region. A third semiconductor region has the second type of conductivity, for example the P type, including the anode region of the first thyristor and the emitter region of the PNP bipolar transistor of the first thyristor.

A fourth semiconductor region has the first type of conductivity, for example the N type, including the cathode region of the first thyristor, the emitter region of the NPN bipolar transistor of the first thyristor, the base region of the PNP bipolar transistor of the second thyristor and the collector region of the NPN bipolar transistor of the second thyristor. A fifth semiconductor region has the second type of conductivity, for example the P type, including the anode region of the second thyristor and the emitter region of the PNP bipolar transistor of the second thyristor.

The common gate region extends at least over the top of the base region of the NPN bipolar transistor of the first thyristor and of the base region of the NPN bipolar transistor of the second thyristor. The device further comprises a first electrical connection connecting the anode region of the first thyristor and the cathode region of the second thyristor so as to form the first terminal of the device, and a second electrical connection connecting the cathode region of the first thyristor and the anode region of the second thyristor so as to form the second device terminal.

In order to push back the avalanche threshold of the device, it is particularly advantageous for the first semiconductor region to comprise an intermediate area, situated between the cathode region of the second thyristor and the semiconductor substrate region, less doped than this cathode region, and for the fourth semiconductor region to also comprise an intermediate area situated between the cathode region of the first thyristor and the semiconductor substrate region being also less doped than the cathode region of the first thyristor.

According to another aspect, a circuit for protection against electrostatic discharges is provided comprising a first circuit terminal, a second circuit terminal and at least one electronic device such as defined hereinbefore having the first device terminal connected to the first circuit terminal and the second terminal of the device connected to the second circuit terminal.

Indeed, even leaving the common gate region floating and the semiconductor substrate region floating, such a device can trigger all by itself but does however exhibit an instability which may be a problem in some applications.

Accordingly, it is preferable for the protection circuit to comprise, according to one embodiment, one (or even several) trigger circuit(s) connected between the first circuit terminal and the second circuit terminal and having a trigger output connected to the common gate region and/or to the semiconductor substrate region. This notably allows the device, and hence the protection circuit, to be rendered more stable.

In order to provide a bidirectional protection, the trigger circuit can be a symmetrical circuit.

As a variant, the protection circuit can comprise a first electronic device such as defined hereinbefore and a second electronic device such as defined hereinbefore, connected between the two circuit terminals. A first trigger circuit is connected between the two circuit terminals and has a trigger output connected to the common gate region and to the semiconductor substrate region of the first device. A second trigger circuit is connected between the two circuit terminals in a symmetrical manner with respect to the first trigger circuit, and has a trigger output connected to the common gate region and to the semiconductor substrate region of the second device.

According to one variant embodiment allowing, in particular, a stable and self-triggering device to be obtained, the common gate region is connected to one of the first and second device terminals via a resistive semiconductor region internal to the device.

More precisely, according to one embodiment, the device comprises a first electrical link, for example a metallization, between the common gate region and a first contact location or connection of the second semiconductor region and a second electrical link, for example a metallization, between a second contact location or connection of the second semiconductor region and one of the first and second device terminals, the portion of the second semiconductor region situated between the two locations forming the internal resistive semiconductor region.

This resistive semiconductor region, which is situated between the two locations of the second semiconductor region which incorporates the substrate region of all the MOS transistors, consequently offers an intrinsic resistance which, with the reversed capacitive NP junction between the base regions of the two bipolar transistors of a thyristor allows this thyristor to be triggered during an ESD pulse propagating from the device terminal, which is not connected to the common substrate region, towards the device terminal which is connected to this substrate region, while at the same time ensuring its stability when it is connected to the terminals of a component in normal operation.

Indeed, this substrate region of the MOS transistors is not floating but connected to one of the device terminals.

Thus, the resistive-capacitive network allowing the corresponding thyristor to be triggered is here a network internal to the device itself since it comprises a resistive path of the semiconductor substrate region and the capacitance of the inverted NP junction between the two base regions of the two bipolar transistors of the corresponding thyristor.

According to another aspect, a circuit for protection against electrostatic discharges is provided comprising a first circuit terminal, a second circuit terminal and at least one self-triggering electronic device such as defined hereinbefore having the first device terminal connected to the first circuit terminal and the second device terminal connected to the second circuit terminal.

In such a manner as to enable a bidirectional protection irrespective of the direction of propagation of an electrostatic pulse, the protection circuit comprises, according to one embodiment, a first self-triggering device such as defined hereinbefore, a second self-triggering device such as defined hereinbefore, the device terminal of the first device which is connected to the common gate region via the internal resistive semiconductor region being connected to the first circuit terminal, the device terminal of the second device which is connected to the common gate region via the internal resistive semiconductor region being connected to the second circuit terminal, the other device terminals of the first and second devices being connected together.

According to another aspect, an input/output cell of an integrated circuit is provided, comprising an input/output lug, a first power supply terminal, designed for example to receive the power supply voltage Vdd, a second power supply terminal, for example designed to be connected to ground, a first protection circuit such as defined hereinbefore coupled between the first power supply terminal and the input/output lug, a second protection circuit such as defined hereinbefore coupled between the input/output lug and the second power supply terminal and a third protection circuit such as defined hereinbefore coupled between the first power supply terminal and the second power supply terminal.

According to another aspect, an integrated circuit is provided comprising at least one input/output cell such as defined hereinbefore.

According to yet another aspect, a method is provided for adjusting the trigger voltage of a self-triggering electronic device such as defined hereinbefore, comprising an adjustment of the length of the resistive semiconductor region.

BRIEF DESCRIPTION OF THE DRAWINGS

Other advantages and features of the invention will become apparent upon examining the detailed description of non-limiting embodiments and their implementation, and the appended drawings in which:

FIGS. 1 to 15 relate to various embodiments and of the invention and their implementation.

DETAILED DESCRIPTION OF ILLUSTRATIVE EMBODIMENTS

Figure 5:
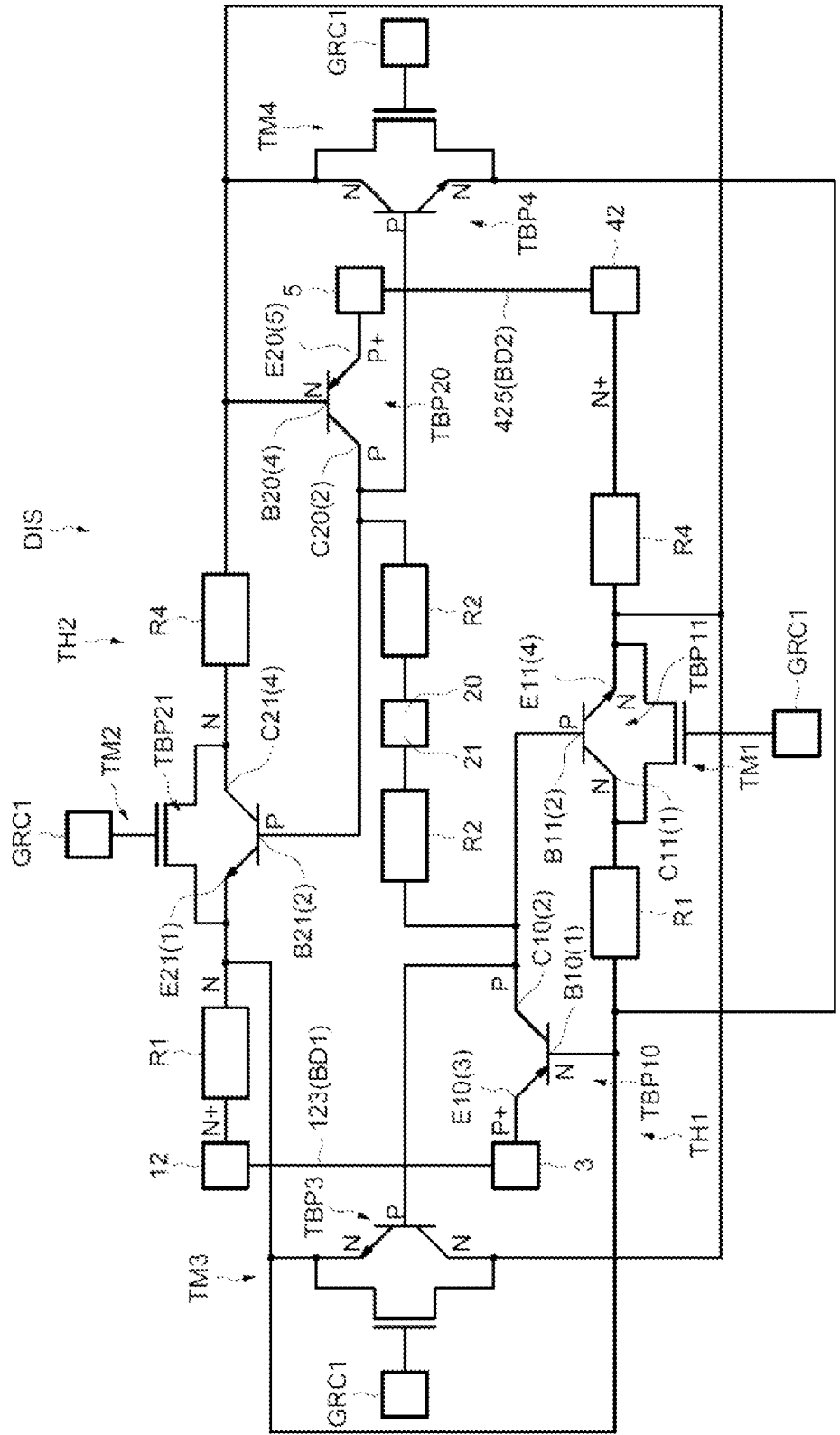

In FIGS. 1, 2, 3 and 4, the reference DIS denotes an electronic device fabricated using a technology of the silicon-on-insulator (SOI) type. For example, the electronic device could be fabricated using a partially depleted SOI (PDSOI) technology.

FIG. 2 is a cross-sectional view along the line II-II in FIG. 1, FIG. 3 is a cross-sectional view along the line III-III in FIG. 1, whereas FIG. 4 is a cross-sectional view along the line IV-IV in FIG. 1.

In such a technology, and as illustrated in these figures, the device DIS is fabricated within a semiconductor film FLM, having for example the P type of conductivity, supported by a layer of buried oxide BX, commonly denoted by those skilled in the art under the acronym BOX, itself supported by a semiconductor carrier substrate SB, for example also of the P type.

As illustrated in these figures, the device DIS is bounded by an insulating region RIS, for example of the shallow trench isolation (or STI) type.

The device DIS comprises a number of semiconductor regions within this semiconductor film FLM, for example of silicon. A first semiconductor region 1 has a first type of conductivity, for example the N type of conductivity. A second semiconductor region 2 has a second type of conductivity opposite to the first, for example the P type of conductivity, and incorporates a semiconductor substrate region 200. A third semiconductor region 3 has the second type of conductivity, here the P type of conductivity. This third semiconductor region here is doped P+. In other words, it is more highly doped than the second semiconductor region 2, doped P.

The device DIS also comprises within the semiconductor film FLM, a fourth semiconductor region 4 having the first type of conductivity, in this case the type of conductivity N, and a fifth semiconductor region 5 having the second type of conductivity, in this case the P type of conductivity.

The third semiconductor region 3 notably forms the anode of a first thyristor TH1 and is doped P+, for example with a dopant concentration of $10^{21}$ atoms/cm³.

The fourth semiconductor region 4 comprises an area 42 doped N+, for example with a dopant concentration of $10^{21}$ atoms/cm³ notably forming the cathode of the first thyristor TH1.

The first semiconductor region 1 comprises an N+ doped area 12, for example with a dopant concentration of $10^{21}$ atoms/cm³ forming the cathode of a second thyristor TH2.

The fifth semiconductor region 5 is P+ doped, for example $10^{21}$ atom/cm³ and forms the anode of the second thyristor TH2.

The first semiconductor region 1 also comprises an area 10 is located between the anode 3 of the first thyristor TH1 and the semiconductor substrate region 200. This area 10 is N doped, for example with a dopant concentration of $10^{18}$ atoms/cm³.

By analogy, the fourth semiconductor region 4 comprises a semiconducting area 40, located between the anode 5 of the second thyristor TH2 and the semiconductor substrate region 2. This area 40 is also N doped with a concentration of dopants for example equal to $10^{18}$ atoms/cm³.

The first semiconductor region also comprises a semiconducting area 11, N doped, located between the cathode region 12 of the second thyristor TH2 and the semiconductor substrate region 200. This area 11 is consequently less doped than the cathode region 12, for example with a dopant concentration of $10^{18}$ atoms/cm³, and will allow the avalanche threshold of the thyristor TH2 to be pushed back.

By analogy, the fourth semiconductor region 4 also comprises a semiconducting area 41, N doped, located between the cathode region 42 of the first thyristor TH1 and the common semiconductor substrate region 200. Here again, this area 41 is less doped than the cathode region 42, for example also with a dopant concentration of $10^{18}$ atoms/cm³, and will allow the avalanche threshold of the first thyristor TH1 to be pushed back.

In such a manner as to short-circuit the anode of the first thyristor TH1 and the cathode of the second thyristor TH2, the device DIS for example comprises a region 123, made of metal silicide, covering a part of the anode region 3 and a part of the cathode region 12. This silicide region 123 enables a contact connection and forms for example a first device terminal BD1.

Similarly, in order to short-circuit the cathode 42 of the first thyristor TH1 and the anode 5 of the second thyristor TH2, the device DIS also for example comprises a region of metal silicide 425 covering a part of the cathode 42 and a part of the anode 5, enabling a contact connection and forming a second device terminal BD2.

The device DIS also comprises an insulated common gate region GR, which can be a semiconductor gate or, as a variant, a metal gate. This gate region GR here covers, as illustrated in FIGS. 2 and 3, for example by means of a gate oxide, the semiconductor substrate region 200 but also a part of the semiconductor regions 1 and 4. Indeed, as will be seen in more detail hereinafter, this gate GR is the gate of several MOS transistors and the fact that this gate GR covers a part of the semiconductor regions 1 and 4 allows any channel discontinuity in the semiconductor substrate region 200 to be avoided.

Furthermore, as can be seen in FIG. 1, the semiconductor region 2 overlaps in the direction of its length, in other words in the direction of the y axis, the gate region GR.

This overlap readily allows the formation of contact connections 20 and 21 on this second semiconductor region 2.

The gate region GR also comprises at its ends two contact connections GRC1 and GRC2.

The device DIS is fabricated here using a 0.13 micron technology and its width LX, measured along the x axis, is of the order of 4 microns, whereas its length LY, measured along the y axis, is slightly less than 8 microns.

As illustrated in FIG. 5, which shows an equivalent electrical circuit diagram of the device DIS in FIGS. 1 to 4, it can be seen that the device DIS comprises the first thyristor TH1 having, at its anode 3, a first PNP bipolar transistor referenced TBP10, and, at its cathode 42, a second NPN bipolar transistor referenced TBP11.

The emitter E10 of the first bipolar transistor TBP10 is connected to (and forms) the anode of the thyristor TH1.

The emitter E11 of the second bipolar transistor TBP11 is connected to (and forms) the cathode of this thyristor TH1.

Furthermore, a first MOS transistor TM1 is coupled between the collector C11 and the emitter E11 of the second bipolar transistor TBP11.

The second thyristor TH2 comprises, at its anode 5, a first transistor PNP referenced TBP20 and, at its cathode 12, a second NPN bipolar transistor referenced TBP21.

The emitter E21 of the bipolar transistor TBP21 is connected to (and forms) the cathode of this second thyristor TH2.

The emitter E20 of the bipolar transistor TBP20 is connected to (and forms) the anode of this second thyristor TH2.

A second MOS transistor TM2 is coupled between the collector C21 and the emitter E21 of the second bipolar transistor TBP21.

The first semiconductor region 1 incorporates the base B10 of the bipolar transistor TBP10, the collector C11 of the bipolar transistor TBP11, the emitter E21 of the bipolar transistor TBP21, together with the cathode region of the second thyristor TH2.

The resistor R1 represents the resistance of this first semiconductor region.

The second semiconductor region 2 incorporates the base B11 of the bipolar transistor TBP11, the collector C10 of the bipolar transistor TBP10, the collector C20 of the bipolar transistor TBP20, the base B21 of the bipolar transistor TBP21 and the common substrate region 200 which includes the substrates of all the MOS transistors of the device DIS.

The resistor R2 represents the resistance of this common substrate region.

The third semiconductor region 3 incorporates the anode of the first thyristor TH1 and the emitter E10 of the transistor TBP10.

The fourth semiconductor region 4 incorporates the cathode 42 of the first thyristor TH1, the emitter E11 of the bipolar transistor TPB11, the base of the bipolar transistor TBP20 and the collector C21 of the bipolar transistor TBP21.

The resistor R4 represents the resistance of this fourth semiconductor region 4.

The fifth semiconductor region 5 incorporates the anode of the second thyristor TH2 and the emitter E20 of the bipolar transistor TBP20.

The device DIS also comprises a third MOS transistor TM3 coupled between the emitters E21 and E11 of the bipolar transistors TBP21 and TBP11 and a fourth MOS transistor TM4 coupled between the bases B20 and B10 of the bipolar transistors TBP20 and TBP10.

The transistor TM3 is coupled to the terminals of an NPN bipolar transistor TBP3 whose base is coupled to the collector C10 of the transistor TBP10.

The transistor TM4 is coupled to the terminals of an NPN bipolar transistor TBP4 whose base is coupled to the collector C20 of the transistor TBP20.

By virtue of the MOS transistors TM3 and TM4, a gain in terms of power handling is therefore obtained.

Furthermore, the P+/N junctions are short-circuited hence eliminating one series diode.

The contacts onto the gates of all the MOS transistors are for example formed by means of the contact GRC1.

The two gated thyristors TH1 and TH2, which respectively comprise the two nested bipolar transistors TBP10 and TBP11, and TBP20 and TBP21, together with the MOS transistors TM1 and TM2, are consequently reverse-connected between the two device terminals BD1 and BD2.

Figure 6:
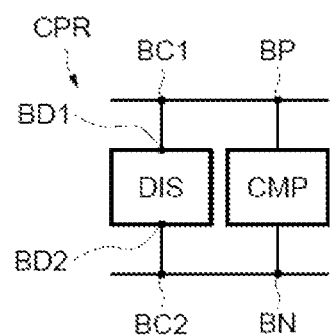

As illustrated in FIG. 6, the device DIS can be used as a circuit CPR for protecting an electronic component CMP against electrostatic discharges. The electronic component may be a single component or else any electronic system to be protected. The terminal BP of the component CMP is connected to a first circuit terminal BC1 and the terminal BN of the component is connected to a second circuit terminal BC2 of the protection circuit.

By way of example, when the component CMP is in operation, the terminal BP can be connected to a positive voltage Vp and the terminal BN can be connected to a voltage Vn that is negative or equal to zero (ground).

When the component CMP is not in operation, it may be subjected to an electrostatic discharge typically resulting in a very short current pulse (typically of a few microseconds) whose current peak is for example of the order of 2 amps and which occurs typically after 10 nanoseconds. Typically, this corresponds for example to a pulsed potential difference applied between the terminals BP and BN through an R-L-C equivalent circuit, whose peak voltage occurs after 10 nanoseconds with an intensity of 1 to 4 kVolts HBM, for example 4 kVolts HBM for 2.5 amps.

It is recalled here that the letters HBM stand for "Human Body Model" well known to those skilled in the art in the field of the protection against electrostatic discharges and notably denote an electrical circuit aimed at modelling an electrostatic discharge delivered by a human being and normally used for testing the sensitivity of the devices to electrostatic discharges. This electrical circuit HBM, which is the R-L-C equivalent circuit mentioned hereinbefore and to which a high voltage is applied, notably comprises a capacitor of 100 pF which discharges through a resistance of 1.5 kilo-ohms in the device to be tested. Thus, in the present case, an electrostatic discharge of 4 kilovolts HBM means that a potential difference of 4 kilovolts is applied to the electrical circuit HBM.

This current pulse should then flow through the circuit CPR and not through the component CMP to be protected.

The circuit CPR accordingly aims to absorb this current pulse and to avoid over-voltages at the terminals of the component CMP.

For this purpose, the terminal BD1 of the device DIS is for example connected to the first terminal BC1, whereas the terminal BD2 of the device is connected to the second terminal BC2.

The common gate region GR and the second semiconductor region 2 can be left floating. In other words, no bias voltage is applied to the contact connections 20 or 21, on the one hand, and GRC1 or GRC2, on the other. When an ESD pulse occurs propagating from the terminal BP towards the terminal BN, the device DIS can trigger, for example in the neighborhood of 5 Volts. However, when the gate region GR and the semiconductor region 2 are left floating, the device DIS exhibits an instability which can be an issue in certain applications.

It is for this reason that it is preferable for the protection circuit CPR to also comprise at least one trigger circuit associated with the device DIS and whose trigger output is for example connected to the gate region GR and to the semiconductor region 2.

Figure 7:
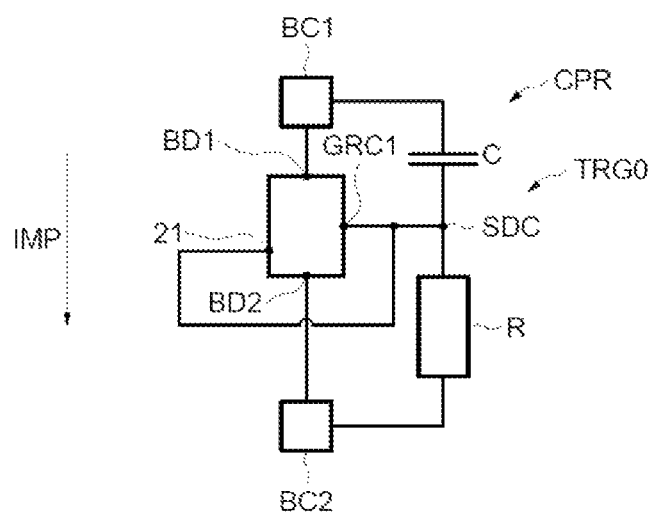

One example of such a protection circuit CPR is illustrated schematically in FIG. 7.

In this embodiment, the trigger circuit TRG0 comprises a capacitor C connected to the first circuit terminal BC1 and a resistor R connected to the second circuit terminal BC2, the common node between the capacitor and the resistor forming a trigger output SDC connected to the common gate region GR and to the common substrate region 200, contained within the region 2, via for example contact connections GRC1 and 21.

Of course, it would have been possible for the trigger output SDC to also be connected to the contact connection GRC2 and to the contact connection 20.

When an ESD pulse IMP occurs propagating from the terminal BC1 towards the terminal BC2, the voltage on the gate of the transistor TM1 and on the base of the bipolar transistor TBP11 (FIG. 5) are connected to the terminal BC1 and hence to the terminal BD1 via the capacitor C. The potential of the terminal BD1 will then increase up to the threshold for driving the MOS transistor TM1 and the second bipolar transistor TBP11 into conduction thus allowing current to flow between the terminals BD1 and BD2. It should be noted here that the MOS transistor TM1 injects a current into the base B11 of the bipolar transistor TBP11 thus improving the triggering of the first thyristor TH1.

At a certain moment, the device DIS goes into lock (the first thyristor TH1 is triggered) and it then goes into high injection mode. The first thyristor TH1 is then self-sustaining; the current passing through the thyristor needs to be cancelled in order to recover the initial, non-triggered, state.

In the presence of an ESD pulse flowing from the terminal BC2 towards the terminal BC1, the voltage on the gate of the MOS transistor TM2 and on the base of the bipolar transistor TBP21 (FIG. 5) are connected to the terminal BC2 via the resistor R.

The potential on the terminal BD2 will then increase up to the threshold for driving the MOS transistor TM2 and the second bipolar transistor TBP21 into conduction thus allowing a current to flow between the terminals BD2 and BD1. It should be noted here that the MOS transistor TM2 injects a current into the base B21 of the bipolar transistor TBP21 thus improving the triggering of the second thyristor TH2.

At a certain moment, the device DIS goes into lock (the second thyristor TH2 triggers) and it then goes into high injection mode. The second thyristor TH2 is then self-sustaining; the current passing through the thyristor needs to be cancelled in order to recover the initial, non-triggered, state.

It is noted therefore that, in this case, the threshold for driving into conduction is reached through the resistor R, whereas in the case of the pulse propagating from the terminal BC1 towards the terminal BC2, the conduction threshold is reached through the capacitor C, hence much faster. The device therefore triggers more quickly in the presence of a pulse propagating from the terminal BC1 towards the terminal BC2 than in the presence of a pulse propagating from the terminal BC2 towards the terminal BC1.

In the example that has just been described, the trigger output SDC is connected to the gate region GR and to the semiconductor region 2. As a variant, it would be possible to connect the trigger output to the gate region GR and the semiconductor region 2 to ground, or else to connect the trigger output to the semiconductor region 2 and the gate region GR to ground.

Figure 8:
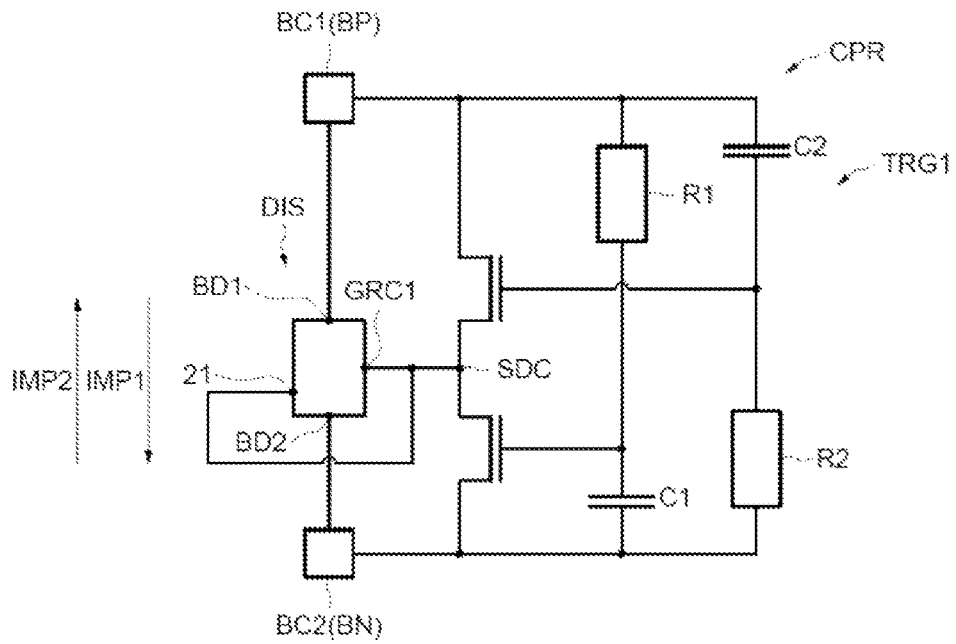

In the case where a similar operation of the protection circuit is desired, whether this be in the presence of an ESD pulse propagating from the terminal BC1 towards the terminal BC2 or from the terminal BC2 towards the terminal BC1, one solution then consists in providing a symmetrical trigger circuit, for example that illustrated in FIG. 8.

In this figure, the trigger circuit TRG1 comprises a first resistor R1 connected in series with a first capacitor C1 between the first circuit terminal BC1 (BP) and the second circuit terminal BC2 (BN). The node common to the resistor R1 and to the capacitor C1 is connected to the gate of a MOS transistor whose drain forms the trigger output SDC of the trigger circuit TRG1.

In a symmetrical manner, the trigger circuit TRG1 comprises a second capacitor C2 connected in series with a second resistor R2 between the first circuit terminal BC1 and the second circuit terminal BC2. The node common to the capacitor C2 and to the resistor R2 is connected to the gate of another MOS transistor whose drain is also connected to the triggering output SDC.

Here again, this trigger output SDC is for example connected to the contact connection GRC1 and to the contact connection 21.

In the presence of a pulse IMP1 propagating from the terminal BC1 towards the terminal BC2, it is the first thyristor TH1 of the device DIS which will be triggered in accordance with what has been described with reference to FIG. 7. On the other hand, in the presence of a pulse IMP2 propagating from the terminal BC2 towards the terminal BC1, it is this time the second thyristor TH2 that will be triggered, in an analogous manner to what has been described hereinbefore with reference to FIG. 7.

Figure 9:
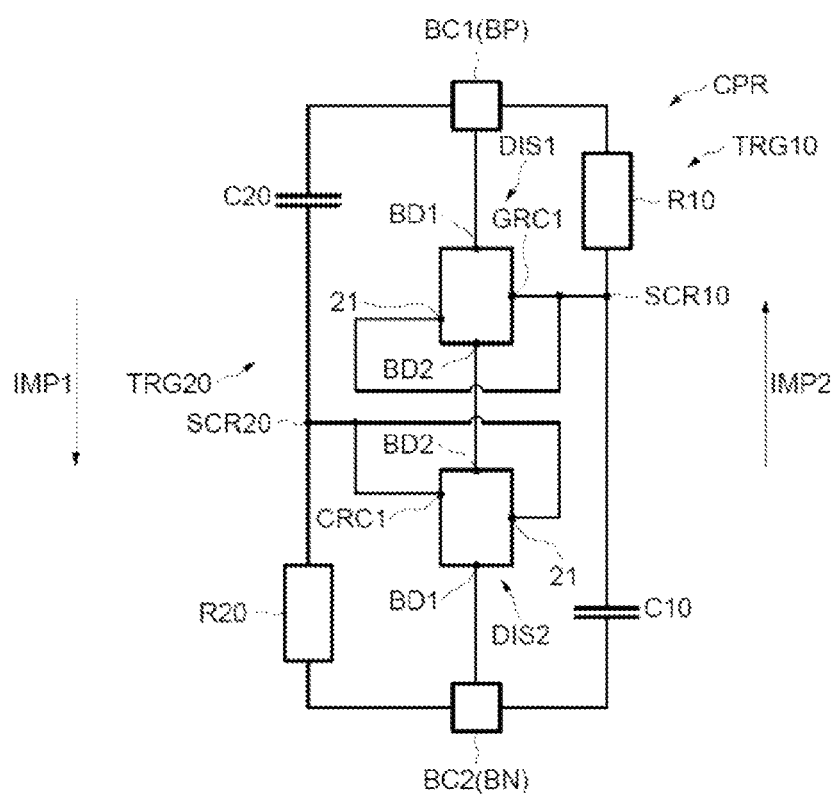

The embodiment illustrated in FIG. 9 also allows a protection circuit CPR with a reversible operation to be obtained irrespective of the direction of propagation of the ESD pulse.

More precisely, the protection circuit CPR comprises a first device DIS1 whose first device terminal BD1 is connected to the first circuit terminal BC1 and whose second device terminal BD2 is connected for example to the second device terminal BD2 of a second device DIS2.

The first device terminal BD1 of this second device DIS2 is connected to the second circuit terminal BC2.

In this exemplary embodiment, the protection circuit CPR comprises, a first trigger circuit TRG10 comprising a resistor R10 and a capacitor C10 connected in series between the terminals BC1 and BC2 and whose common node forms a trigger output SCR10 connected to the common gate region GR and to the common substrate region of the device DIS1, for example to the contact connections GRC1 and 21.

The protection circuit CPR also comprises a second trigger circuit TRG20 comprising a capacitor C20 connected in series with a resistor R20 between the terminals BC1 and BC2 and whose common node forms a trigger output SCR20 connected to the common gate region and to the common substrate region of the second device DIS2, for example to the contact connections GRC1 and 21.

In the presence of a pulse IMP1 propagating from the terminal BC1 towards the terminal BC2, the first device DIS1 is conducting owing to the presence of the resistor R10 and it is the trigger circuit TRG20 that makes the second device DIS2 (and more particularly its first thyristor) trigger in an analogous manner to what has been described hereinbefore.

On the other hand, in the presence of a pulse IMP2 propagating from the terminal BC2 towards the terminal BC1, it is now the second device DIS2 that is conducting owing to the presence of the resistor R20 and it is the trigger circuit TRG10 that makes the first device DIS1 (and more particularly its first thyristor) trigger in an analogous manner to that which has been described hereinbefore.

In the embodiments which have just been described, with reference to FIGS. 6, 7 and 8, trigger thresholds of around 4 volts can be obtained.

Figure 10:
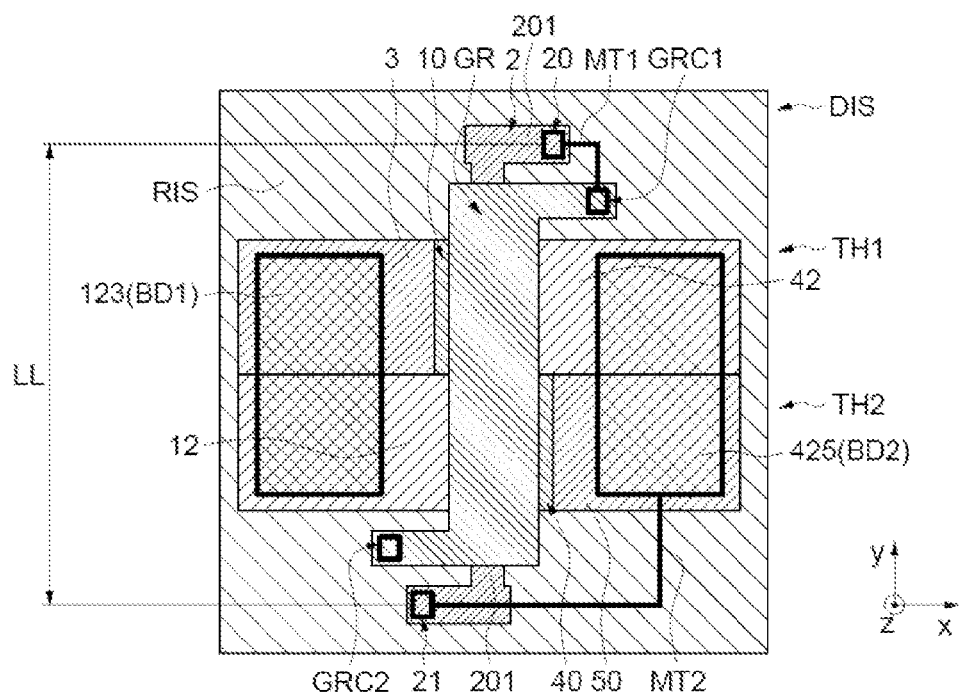

Whereas in the embodiments which have been discussed hereinbefore, the device DIS could potentially be self-triggering but exhibited an instability or else required the presence of a trigger circuit, the device DIS illustrated in FIG. 10 is self-triggering, in other words not requiring the presence of a trigger circuit, while at the same time offering an enhanced stability.

With regard to FIG. 1, the common region GR of the device DIS in FIG. 10 is this time connected to one of the first and second terminals of the device, here the second device terminal BD2, via a resistive semiconductor region 201 internal to the device, in this case the portion of the semiconductor region 2 situated between the two contact connections (locations) 20 and 21, and which incorporates the common substrate region.

In this respect, the device DIS in FIG. 10 comprises a first electrical link, for example a first metallization MT1, between the contact connection 20 and the contact connection GRC1 and a second electrical link, for example a second metallization MT2, between the contact connection 21 and the second device terminal BD2.

For this purpose, the overlap of the semiconductor region 2 in the direction of its length, in other words in the direction of the y axis, readily allows the formation of the electrical links MT1 and MT2 which may for example be formed at the first metallization level of the integrated circuit incorporating the device DIS.

The part 201 of the second semiconductor region 2 situated between the two contact connections 20 and 21 forms the internal resistive semiconductor region having an intrinsic resistance.

When an ESD pulse occurs propagating from the first device terminal BD1 towards the second device terminal BD2, the first thyristor TH1 of the device triggers by itself at a certain moment in time without the need to have a trigger circuit. Indeed, it is the intrinsic resistance included between the contact connections 20 and 21, together with the intrinsic capacitances of junctions, which act as a trigger circuit.

Furthermore, in an analogous manner to what has been described hereinbefore, when the first thyristor TH1 triggers, high injection mode is instigated. The first thyristor TH1 is then self-sustaining and, here again, the current flowing through this thyristor needs to be cancelled in order to recover the initial non-triggered state.

The fact that the semiconductor region 2 is not floating but connected to one of the device terminals allows the device to be rendered stable.

Figure 11:
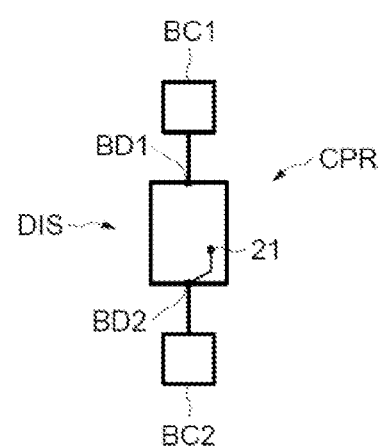

As illustrated in FIG. 11, the device DIS in FIG. 10 can here again be used as a circuit CPR for protecting a component against electrostatic discharges. Here again, the component may be any electrical system to be protected.

More precisely, the first device terminal BD1 of the device is for example connected to the first circuit terminal BC1 (the terminal BP of the component) whereas the second terminal BD2 is connected to the second circuit terminal BC2 (the terminal BN of the component for example).

Figure 12:
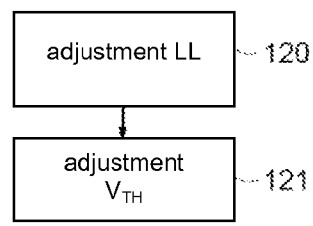

The value of the resistance of the internal resistive semiconductor region situated between the locations 20 and 21 allows the trigger voltage of the corresponding thyristor to be adjusted. Furthermore, as illustrated in FIG. 12, the adjustment of the value of the resistance of the internal resistive semiconductor region is obtained by an adjustment (step 120) of the length LL (FIG. 10) between the locations 20 and 21 which leads to an adjustment of the trigger voltage $V_{TH}$ (step 121).

Thus, for a length LL1 equal to 5 microns, a trigger voltage $V_{TH}$ of 4 volts is obtained.

On the other hand, if the length of the device is increased, in other words for a length LL2 greater than LL1, the trigger voltage is decreased. Thus, for a length LL2 equal to 10 microns a trigger voltage $V_{TH}$ of around 3.5 volts is obtained.

Figure 13:
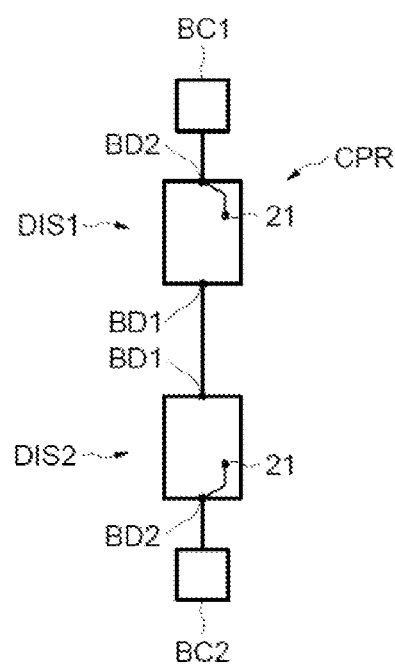

In order to allow a bidirectional protection, the circuit CPR can comprise, as illustrated in FIG. 13, a first device DIS1 of the type of that illustrated in FIG. 10 and a second device DIS2 of the type of that illustrated in FIG. 10.

The two terminals BD1 of the two devices are connected together, in other words the terminals that are not connected to the substrate connection point 21.

The two other device terminals BD2 of the two devices DIS1 and DIS2, in other words those that are connected to the substrate connection 21, are respectively connected to the first circuit terminal BC1 and to the second circuit terminal BC2.

For this reason, during an ESD pulse propagating from the terminal BC1 towards the terminal BC2, it is the second device DIS2 that will trigger (and more particularly the first thyristor TH1), the first device DIS1 being conducting, whereas in the presence of an ESD pulse propagating from the terminal BC2 towards the terminal BC1, it is the first device DIS1 that will trigger (and more particularly the first thyristor TH1), the second device DIS2 then being conducting.

It should be noted that, although it would have been possible to connect the terminals BD2 together and to connect the terminals BD1 to the respective circuit terminals, the embodiment in FIG. 13 has the advantage of not leaving the nodes BD2 floating.

It is particularly advantageous to incorporate devices for protection against electrostatic discharges of the type of those which have just been described into an input-output cell of an integrated circuit.

Figure 14:
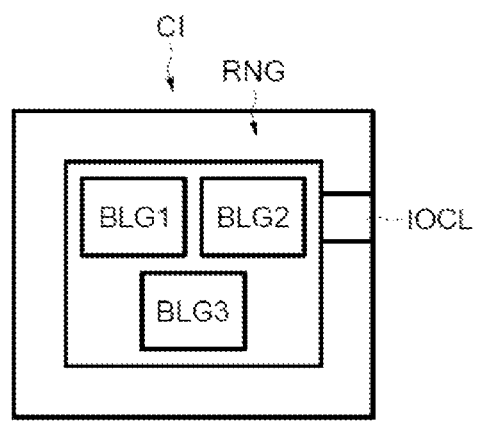

By way of non-limiting example, such input/output cells IOCL may be disposed, as illustrated in FIG. 14, within a ring RNG on the periphery of the integrated circuit CI.

These cells IOCL can for example transport power supply voltages and/or data signals destined for and/or coming from functional blocks BLG1-BLG3 of the integrated circuit.

Figure 15:
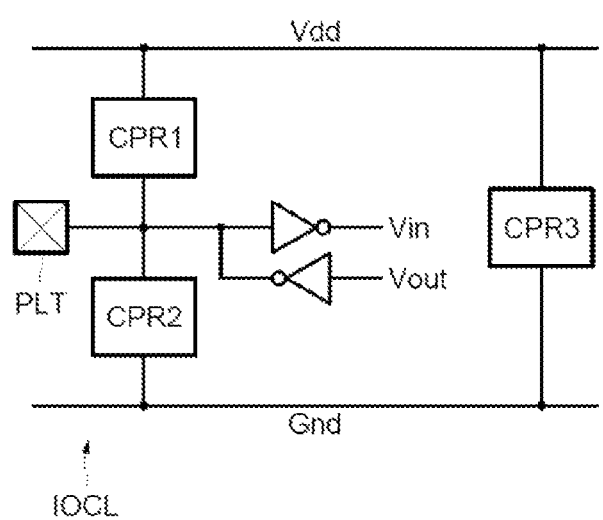

As illustrated in FIG. 15, the input-output cell comprises for example an input-output lug PLT for receiving/transmitting a signal. This cell comprises two supply terminals Vdd and Gnd. A first bidirectional protection circuit CPR1 of the type of that which has just been described hereinbefore is disposed between the power supply terminal Vdd and the input-output lug PLT.

A second bidirectional protection circuit CPR2 is disposed between the input-output lug PL2 and the second power supply terminal Gnd. Finally, a third bidirectional protection circuit CPR3 is disposed between the two supply terminals Vdd and Gnd.

Thus, such an input-output cell is protected, in an extremely simple manner, against an electrostatic discharge occurring between the two supply terminals Vdd and Gnd, and also against an electrostatic discharge that may occur either between the power supply terminal Vdd and the input-output lug or between the input-output lug and the power supply terminal Gnd. The functional blocks connected between the two terminals Vdd and Gnd are therefore also protected against an electrostatic discharge.

What is claimed is:

1. An electronic device, comprising:
   a first device terminal;
   a second device terminal;
   a first thyristor and a second thyristor reverse-connected between the first and second device terminals, each thyristor including an anode, a cathode, an NPN bipolar transistor and a PNP bipolar transistor, each bipolar transistor having an emitter, a base, and a collector;
   a first MOS transistor and a second MOS transistor coupled between conduction electrodes of the NPN bipolar transistors of the first and second thyristors;
   a third MOS transistor coupled between emitters of the NPN bipolar transistors of the first and second thyristors;
   a fourth MOS transistor coupled between bases of the PNP bipolar transistors of the first and second thyristors;
   a gate region common to the first, second, third and fourth MOS transistors; and
   a common semiconductor region, wherein the first, second, third and fourth MOS transistors are formed within the common semiconductor region.

2. The device according to claim 1, further comprising a silicon-on-insulator type (SOI) substrate that includes a semiconductor film arranged over an insulating layer that is arranged over a carrier substrate, the common semiconductor region being disposed within the semiconductor film.

3. The device according to claim 2, wherein the common semiconductor region comprises:
   a first semiconductor region having a first type of conductivity and including the base of the PNP bipolar transistor of the first thyristor, the collector of the NPN bipolar transistor of the first thyristor, the emitter of the NPN bipolar transistor of the second thyristor and the cathode of the second thyristor;
   a second semiconductor region having a second type of conductivity opposite the first type of conductivity, the second semiconductor region incorporating the base of the NPN bipolar transistor of the first thyristor, the collector of the PNP bipolar transistor of the first thyristor, the base of the NPN bipolar transistor of the second thyristor, the collector of the PNP bipolar transistor of the second thyristor and the common semiconductor region;
   a third semiconductor region having the second type of conductivity and including the anode of the first thyristor and the emitter of the PNP bipolar transistor of the first thyristor;
   a fourth semiconductor region having the first type of conductivity and including the cathode of the first thyristor, the emitter of the NPN bipolar transistor the first thyristor, the base of the PNP bipolar transistor of the second thyristor and the collector of the NPN bipolar transistor of the second thyristor; and a fifth semiconductor region having the second type of conductivity and including the anode of the second thyristor and the emitter of the PNP bipolar transistor of the second thyristor.

4. The device according to claim 3, wherein the gate region extends at least over the base of the NPN bipolar transistor of the first thyristor and the base of the NPN bipolar transistor of the second thyristor.

5. The device according to claim 3, further comprising:
a first electrical connection connecting the anode of the first thyristor and the cathode of the second thyristor so as to form the first device terminal; and
a second electrical connection connecting the cathode of the first thyristor and the anode of the second thyristor so as to form the second device terminal.

6. The device according to claim 5, wherein the first semiconductor region comprises an intermediate region located between the cathode of the second thyristor and the common semiconductor region and less doped than the cathode, and wherein the fourth semiconductor region comprises an intermediate region located between the cathode of the first thyristor and the common semiconductor region and less doped than the cathode.

7. The device according to claim 3, wherein the common gate region is connected to one of the first and second device terminals via a resistive semiconductor region internal to the device, the device comprising a first electrical link between the common gate region and a first location of the second semiconductor region and a second electrical link between a second location of the second semiconductor region and one of the first and second terminals, a portion of the second semiconductor region between the first and second locations forming the internal resistive semiconductor region.

8. The device according to claim 7, wherein the second semiconductor region and the internal resistive semiconductor region extend outside of the common gate region.

9. The device according to claim 1, wherein the common gate region is connected to one of the first and second device terminals via a resistive semiconductor region internal to the device.

10. A method for adjusting a trigger voltage of a device according to claim 9, the method comprising adjusting a length of the internal resistive semiconductor region.

11. A circuit, comprising:
electronic circuitry to be protected from ESD, the electronic circuitry comprising a first circuit terminal and a second circuit terminal;
a first thyristor and a second thyristor reverse-connected between the first and second circuit terminals, each thyristor including an anode, a cathode, an NPN bipolar transistor and a PNP bipolar transistor, each bipolar transistor having an emitter, a base, and a collector;
a first MOS transistor and a second MOS transistor coupled between conduction electrodes of the NPN bipolar transistors of the first and second thyristors;
a third MOS transistor coupled between emitters of the NPN bipolar transistors of the first and second thyristors;
a fourth MOS transistor coupled between bases of the PNP bipolar transistors of the first and second thyristors;
a common gate region common to the first, second, third and fourth MOS transistors; and a common semiconductor region, wherein the first, second, third and fourth MOS transistors are formed within the common semiconductor region.

12. The circuit according to claim 11, further comprising a trigger circuit coupled between the first circuit terminal and the second circuit terminal, the trigger circuit having a trigger output coupled to the common gate region and to the common semiconductor region.

13. The circuit according to claim 12, wherein the trigger circuit comprises a symmetrical trigger circuit.

14. The circuit according to claim 11, further comprising a resistive semiconductor region, wherein the common gate region is connected to one of the first and second circuit terminals via the resistive semiconductor region.

15. The circuit according to claim 11, further comprising:
a third thyristor and a fourth thyristor reverse-connected between the first and second circuit terminals in series with the first and second thyristors, each thyristor including an anode, a cathode, an NPN bipolar transistor and a PNP bipolar transistor, each bipolar transistor having an emitter, a base, and a collector;
a third MOS transistor and a fourth MOS coupled between conduction electrodes of the NPN bipolar transistors of the third and fourth thyristors;
a fifth MOS transistor coupled between emitters of the NPN bipolar transistors of the third and fourth thyristors;
a sixth MOS transistor coupled between bases of the PNP bipolar transistors of the third and fourth thyristors;
a second common gate region common to the third, fourth, fifth and sixth MOS transistors;
a second common semiconductor region, wherein the third, fourth, fifth and sixth MOS transistors are formed within the second common semiconductor region;
a first trigger circuit coupled between the first and second circuit terminals and having a trigger output connected to the common gate region and to the common semiconductor region; and
a second trigger circuit coupled between the first and second circuit terminals in a symmetrical manner with respect to the first trigger circuit, the second trigger circuit having a trigger output coupled to the second common gate region and to the second common semiconductor region.

16. The circuit according to claim 15, further comprising:
a first resistive semiconductor region, wherein the common gate region is connected to the first circuit terminal via the first resistive semiconductor region; and
a second resistive semiconductor region, wherein the second common gate region is connected to the second circuit terminal via the second resistive semiconductor region.

17. The circuit according to claim 16, wherein the first and second thyristors are both coupled to the third and fourth thyristors at a common series connection point.

18. An input/output cell of an integrated circuit, comprising:
an input/output lug;
a first power supply terminal;
a second power supply terminal;
a first protection circuit having first and second circuit terminals coupled between the first power supply terminal and the input/output lug;
a second protection circuit having first and second circuit terminals coupled between the input/output lug and the second power supply terminal; and a third protection circuit having first and second circuit terminals coupled between the first power supply terminal and the second power supply terminal;

wherein the first, second, and third protection circuits each comprise:
- a first thyristor and a second thyristor reverse-connected between the first and second circuit terminals, each thyristor including an anode, a cathode, an NPN bipolar transistor and a PNP bipolar transistor, each bipolar transistor having an emitter, a base, and a collector;
- a first MOS transistor and a second MOS transistor coupled between conduction electrodes of the NPN bipolar transistors of the first and second thyristors;
- a third MOS transistor coupled between emitters of the NPN bipolar transistors of the first and second thyristors;
- a fourth MOS transistor coupled between bases of the PNP bipolar transistors of the first and second thyristors;
- a common gate region common to the first, second, third and fourth MOS transistors; and
- a common semiconductor region, wherein the first, second, third and fourth MOS transistors are formed within the common semiconductor region.

19. The circuit according to claim 18, wherein the first, second, and third protection circuits each comprise a resistive semiconductor region, wherein the common gate region is connected to one of the first and second circuit terminals via the resistive semiconductor region.

20. An integrated circuit comprising an input/output cell according to claim 18.

* * * * *